United States Patent
Tredicucci et al.

(10) Patent No.: US 7,382,806 B2
(45) Date of Patent: *Jun. 3, 2008

(54) THZ SEMICONDUCTOR LASER INCORPORATING A CONTROLLED PLASMON CONFINEMENT WAVEGUIDE

(75) Inventors: Alessandro Tredicucci, Pisa (IT); Fabio Beltram, Gorizia (IT); Harvey Edward Beere, Royston (GB); Alexander Giles Davies, Cambridge (GB); Ruedeger Koehler, Berlin (DE); Edmund Harold Linfield, Cambridge (GB)

(73) Assignee: INFM Istituto Nazionale per La Fisica Della Materia, Genoa (IT)

( * ) Notice: Subject to any disclaimer, the term of this patent is extended or adjusted under 35 U.S.C. 154(b) by 265 days.

This patent is subject to a terminal disclaimer.

(21) Appl. No.: 10/508,996

(22) PCT Filed: Mar. 24, 2003

(86) PCT No.: PCT/IB03/01080

§ 371 (c)(1),
(2), (4) Date: Sep. 27, 2004

(87) PCT Pub. No.: WO03/081736

PCT Pub. Date: Oct. 2, 2003

(65) Prior Publication Data
US 2005/0117618 A1  Jun. 2, 2005

(30) Foreign Application Priority Data
Mar. 27, 2002  (IT) .......................... TO2002A0274

(51) Int. Cl.
*H01S 3/30* (2006.01)
(52) U.S. Cl. ...................................... 372/4; 372/34.01
(58) Field of Classification Search ................ 372/4
See application file for complete search history.

(56) References Cited

U.S. PATENT DOCUMENTS 5,502,787 A * 3/1996 Capasso et al. ............. 385/123

(Continued)

OTHER PUBLICATIONS

Colombelli et al. "Far infrared Surface Plasmon Quantum Cascade Lasers at 21.5um and 24um Wavelengths"; APL vol. 28, No. 18, pp. 2620-2622, Apr. 30, 2001.*

(Continued)

*Primary Examiner*—Minsun Oh Harvey
*Assistant Examiner*—Tod T. Van Roy
(74) *Attorney, Agent, or Firm*—Sughrue Mion, PLLC

(57) ABSTRACT

A semiconductor laser comprises an active region (12) which, in response to a pumping energy applied thereto, can produce a stimulated emission of radiation with a central wavelength ($\lambda$) in the far infrared region, and a confinement region (16, 18, 22) suitable for confining the radiation in the active region (12), and comprising at least one interface (16a, 16b, 22a) between adjacent layers that is capable of supporting surface plasmon modes generated by an interaction of the interface with the radiation. The confinement region (16, 18, 22) comprises a wave-guide layer (16) which is delimited on opposite sides by a first interface and by a second interface (16a, 16b). The guide layer (16) is doped in a manner such that the first and second interfaces (16a, 16b) are capable of supporting the plasmon modes, respectively, and is of a thickness (d) such as to bring about the accumulation of the plasmon modes in proximity to the first and second interfaces (16a, 16b), outside the layer (16), and substantially a suppression of the plasmon modes, inside the layer.

13 Claims, 5 Drawing Sheets

Figure 1:
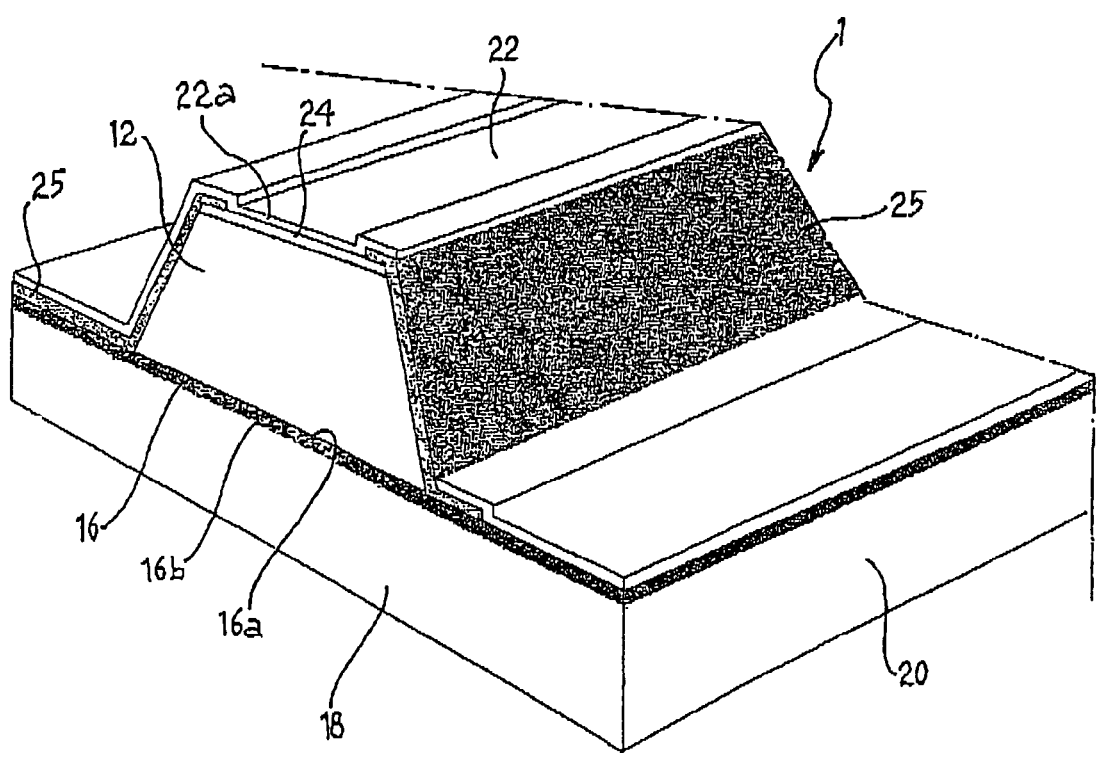

U.S. PATENT DOCUMENTS 6,301,282 B1 * 10/2001 Capasso et al. .......... 372/46.01
6,501,783 B1 * 12/2002 Capasso et al. ................ 372/96
6,829,269 B2 * 12/2004 Goodhue et al. ........ 372/43.01
2006/0153262 A1 * 7/2006 Barbieri et al. .......... 372/43.01

OTHER PUBLICATIONS

Sirtori et al. "Quantum cascade laser with plasmon enhanced waveguide operating at 8.4um wavelength"; APL, vol. 66, No. 24, pp. 3242-3244, Jun. 12, 1995.*

R. Colombelli, et al.: "Far-Infrared Surface-Plasmon Quantum-Cascade Lasers at 21.5 Mum a nd24 Mum Wavelengths"; Applied Physics Letters, American Institute of Physics. New York, US, vol. 28, No. 18, Apr. 30, 2001, pp. 2620-2622, XP001059510, ISSN: 0003-6951, cited in the application p. 2620, right hand column, paragraph 2, Figures 1, 2, p. 2621. left-hand column, paragraph 2, pp. 2622, right-hand column, paragraph 1.

R. Koehler, et al.: "High Intensity Interminiband Terahertz Emission From Chirped Superlattices" Applied Physics Letters, American Institute of Physics. New York, US, vol. 80, No. 11, Mar. 18, 2002, pp. 1867-1869, XP001108440, ISSN: 0003-6951, abstract p. 1867, left-hand column-right-hand column.

R. Koehler, et al.: "Terahertz Semiconductor-Heterostructure Laser" Nature, Macmillan Journals Ltd., London, GB, vol. 417, May 9, 2002, pp. 156-159, XP001147572, ISSN: 0028-0836.

M. Rocchat et al.: "Lowe-Threshold Terahertz Quantum-Cascade Lasers" Applied Physics Letters, American Institute of Physics. New York, US, vol. 81. No. 8, Aug. 19, 2002, pp. 1381-1383, XP001142480, ISSN: 0003-6951.

C, Sirtori, et al.: "Low-loss Al-Free Waveguides for Unipolar Semiconductor Lasers" Applied Physics Letters, American Institute of Ohysics. New York, US, vol. 75, No. 25, Dec. 20, 1999,pp. 3911-3913, XP000902551, ISSN: 0003-6951, p. 3911, right-hand column; figure 1 and 2, p. 36912, left-hand column, line 1-line 13, p. 3912, right-hand column, line 1-6, p. 3913, left-hand column, paragraph 3.

* cited by examiner

THZ SEMICONDUCTOR LASER INCORPORATING A CONTROLLED PLASMON CONFINEMENT WAVEGUIDE

This is a National Stage entry of Application No. PCT/IB2003/001080 filed Mar. 24, 2003; the disclosure of which is incorporated herein by reference.

BACKGROUND OF THE INVENTION

It is generally known that the 1-10 THz frequency region (also defined as far infrared) is difficult to reach with sources based on semiconductor devices or, more generally, solid-state devices (R. E. Miles et al., Terahertz Sources and Systems, NATO ASI Series, Kluwer 2001). In fact, electronic components based on the oscillation of free charges, such as Gunn diodes or resonant tunnel-effect diodes, can reach frequencies of about one hundred GHz at most. At the other end of the spectrum, conventional diode lasers operating on optical transitions from the conduction band to the valence band of the semiconductor material are typically limited to visible or near/middle infrared frequencies (>30 THz).

There is, however, very great technological interest in this region of the spectrum in view of the many requirements in the fields of spectroscopy, of wireless communications, and of the production of images for medical purposes or security checks. In fact, the particular transparency or opacity characteristics of various substances within this frequency range are very suitable for the examination of biological tissues (in a manner similar and complementary to X-rays) or for use in surveillance operations in which it is necessary to examine objects that are concealed from view by garments or plastics containers. Finally, the transparency of construction materials and the large bandwidth available make these frequencies an optimal choice for intra-building communications of the future.

In principle, the quantum-cascade lasers (QCLs) that have recently been developed offer the capability to generate electromagnetic radiation in the far infrared range. These are, in fact, unipolar devices operating on transitions between sub-bands of states belonging to the same conduction band, resulting from the quantum confinement of the electrons in a substantially two-dimensional heterostructure (J. Faist et al., Science 264, 553, 1994). The energy separation between these sub-bands, and hence the frequency of the photons emitted, therefore depends mainly on the thickness of the semiconductor layers in which the electrons are confined and not on the electronic structure of the original material. In the current state of the art, QCLs have been produced to cover the entire middle infrared range up to a maximum wavelength of 24 μm (12.5 THz) (R. Colombelli et al., Appl. Phys. Lett. 78, 2620, 2001). However, the production of a QCL operating in the THz range has remained impracticable up to now for various reasons. In the first place, there is the need to develop wave-guides of thicknesses (about 10 μm) compatible with the QCL growth system (molecular-beam epitaxy or MBE), which can effectively confine radiation of much longer wavelengths (~100 μm) without increasing optical losses to prohibitive values. In the second place, there is the need to design the active region in a manner such as to ensure the population inversion that is necessary to compensate for the cavity losses. This latter need is more complex than in conventional QCLs owing to the fact that the energies involved become less than that of the optical phonon. This completely changes the dynamics of the non-radiative relaxation processes and requires a different approach on which to base the creation of the electronic structure.

In the current state of the art, there are therefore only QC devices that are capable of spontaneous emission at the frequencies of interest herein (with powers of the order of tens of pW in the THz range), without any evidence of laser effect or, even less, of gain (M. Rochat et al., Appl. Phys. Lett. 73, 3724, 1998 and J. Ulrich et al., Appl. Phys. Lett. 76, 19, 2000).

The present device, like other semiconductor lasers, is composed of an active material in which the electromagnetic radiation is generated by virtue of electron injection. This is introduced into a wave-guide which is capable of confining the radiation in the particular region of space which is occupied by the active material and which defines the lateral dimensions of the optical cavity that is necessary for the operation of the laser. Given the two-dimensional characteristic structure of the active regions of QCLs, it is necessary to implement a planar wave-guide which provides for the confinement of the radiation in the direction in which the semiconductor material is grown, leaving the definition of the cavity in the perpendicular directions simply to the processes by which the device is produced (lithography, etc.). At visible or near and middle infrared frequencies, this wave-guide is generally produced by enclosing the active material between two or more layers of a different semiconductor with a lower refractive index. As is known, by virtue of the principle of total internal reflection, a wave-guide generally called a dielectric wave-guide, with operation similar to optical fibres, is thus produced. However, this approach cannot be used for frequencies in the THz range (wavelengths of about 100 μm) since it would require thicknesses of the semiconductor layers of the order of or greater than the wavelength, which are absolutely impracticable for the growth techniques (MBE, MOCVD) that are generally used. Moreover, since injection devices are involved, the semiconductors used must have a predetermined level of doping to ensure optimal transport properties. This would result into very high losses by absorption since the absorption coefficient "k" of the free carriers in a doped semiconductor is proportional to the square of the wavelength and thus becomes enormous in the far infrared range (P. Y. Yu and M. Cardona, Fundamentals of Semiconductors, Springer-Verlag, Berlin, 1996). Recently, owing to the development of QCLs with wavelengths greater than 15 μm, a new wave-guide based on surface plasmons, has been used (C. Sirtori, et al., Opt. Lett. 23, 1366, 1998; A. Tredicucci et al., Appl. Phys. Lett. 76, 2164, 2000). Surface plasmons are optical modes that are confined at the interface between two materials with dielectric constants of opposite sign such as, for example, a metal and a semiconductor. They are TM-polarized (and are therefore very suitable for QC lasers which emit TM-polarized light) and have an electric-field profile with the maximum at the interface and an exponential decay on both sides in the direction perpendicular to the surface. If $\epsilon_1$ is the dielectric constant of the metal and $\epsilon_2$ is that of the semiconductor, the penetration of the surface plasmon into the two materials is given by:

$$\delta_{1,2} = \frac{\lambda}{2} \left| Re \left[ \varepsilon_{1,2} \sqrt{\frac{-1}{\varepsilon_1 + \varepsilon_2}} \right] \right|^{-1} \quad (1)$$

The penetration into the metal layer will thus be less the more negative is its dielectric constant [Re($\epsilon$)=n$^2$-k$^2$]. This aspect is important because the metal is notably absorbent (k>>1) and too pronounced a penetration of the optical mode would cause unacceptable losses. This explains why wave-guides based on surface plasmons are effective only for lasers of sufficiently long wavelength ($\lambda$>15 µm), in which the dielectric constants of the metals become ever more negative (k$^2$>>n$^2$).

The order of magnitude of the loss in surface plasmon wave-guides formed in QC lasers of longer wavelength is about one hundred cm$^{-1}$ (A. Tredicucci et al., Appl. Phys. Lett. 76, 2164, 2000; R. Colombelli et al., Appl. Phys. Lett. 78, 2620, 2001). Moreover, from the formula given above, since the dielectric constant of the semiconductor is relatively small and almost exactly real, it also seems clear that the penetration into the semiconductor is approximately inversely proportional to that into the metal (and in the far infrared range may thus also become very considerable). These characteristics mean that a surface plasmon wave-guide of the type used up to now is also not usable with success for a THz laser.

SUMMARY OF THE INVENTION

The object of the present invention is to provide a laser device which can overcome the above-mentioned problems and which is therefore capable of operating effectively at 1-10 THz frequencies.

In a laser device constructed in this manner, the wave-guide comprises a highly doped semiconductor layer (preferably with a concentration of carriers of the order of 10$^{18}$ cm$^{-3}$) which has a negative dielectric constant but with a modulus suitably matched to the thickness of the layer (preferably of a few hundred nm) and to the dielectric constant of the surrounding material. This permits the formation of a particular optical mode which is strongly confined to dimensions even less than the wavelength in the material and at the same time with very low attenuation factors of the order of 10 cm$^{-1}$.

An advantage of this solution also consists of the fact that is possible to use this doped layer for the production of an electronic contact with the active region of the laser, thus making it feasible to use non-doped substrates which are much less absorbent than the doped substrates generally used in QCLs.

The use of this wave-guide of novel design permits optical losses in the real device of barely 17 cm$^{-1}$ with a factor of confinement of the radiation in the active region of 0.46 at a wavelength of 70 microns. These extremely favourable characteristics enable the laser effect to be achieved even with active materials in which the population inversion is minimal and the gain limited, as is the case in the QC structures designed up to now, in this region of the electromagnetic spectrum.

Figure 2:
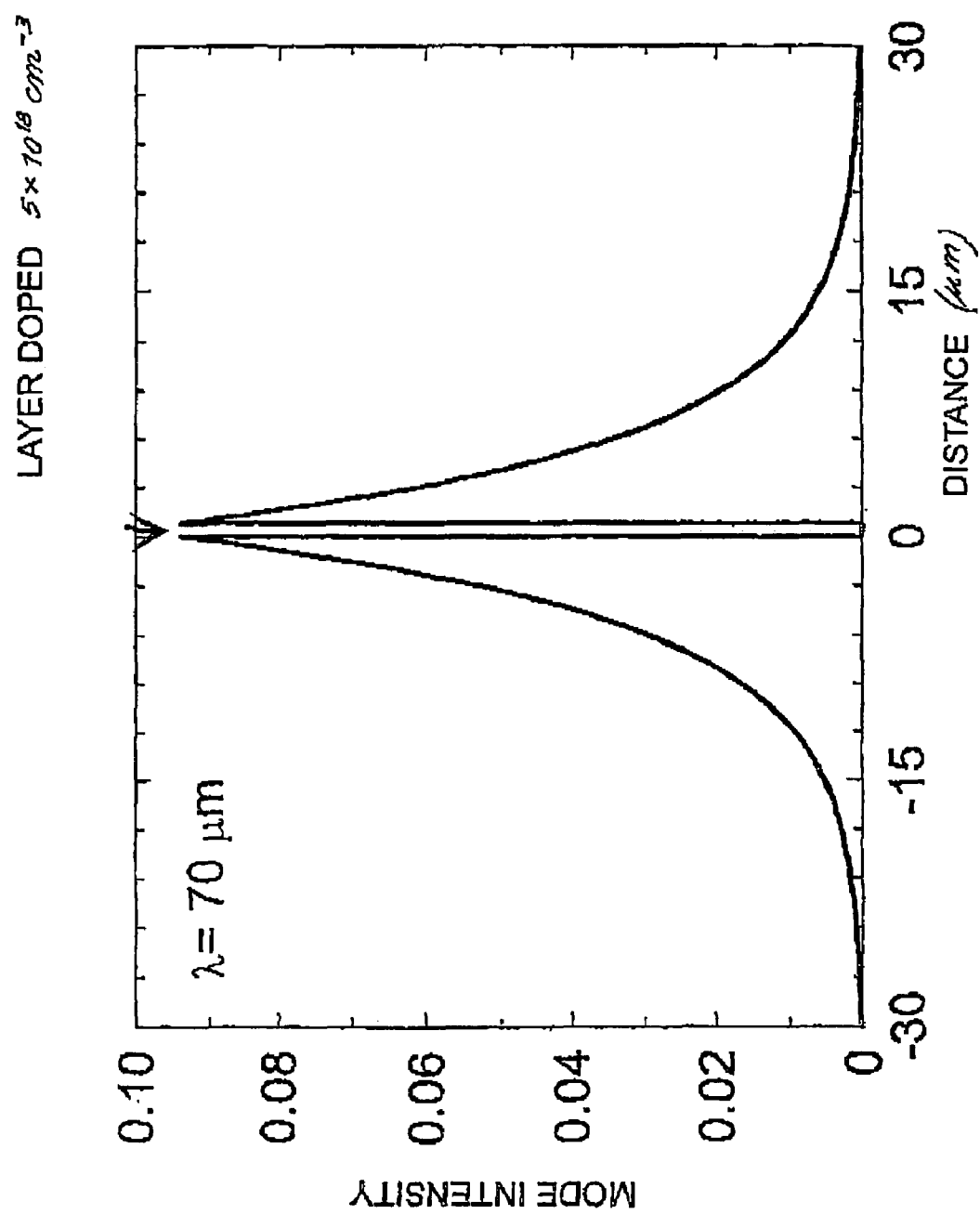
Figure 3:
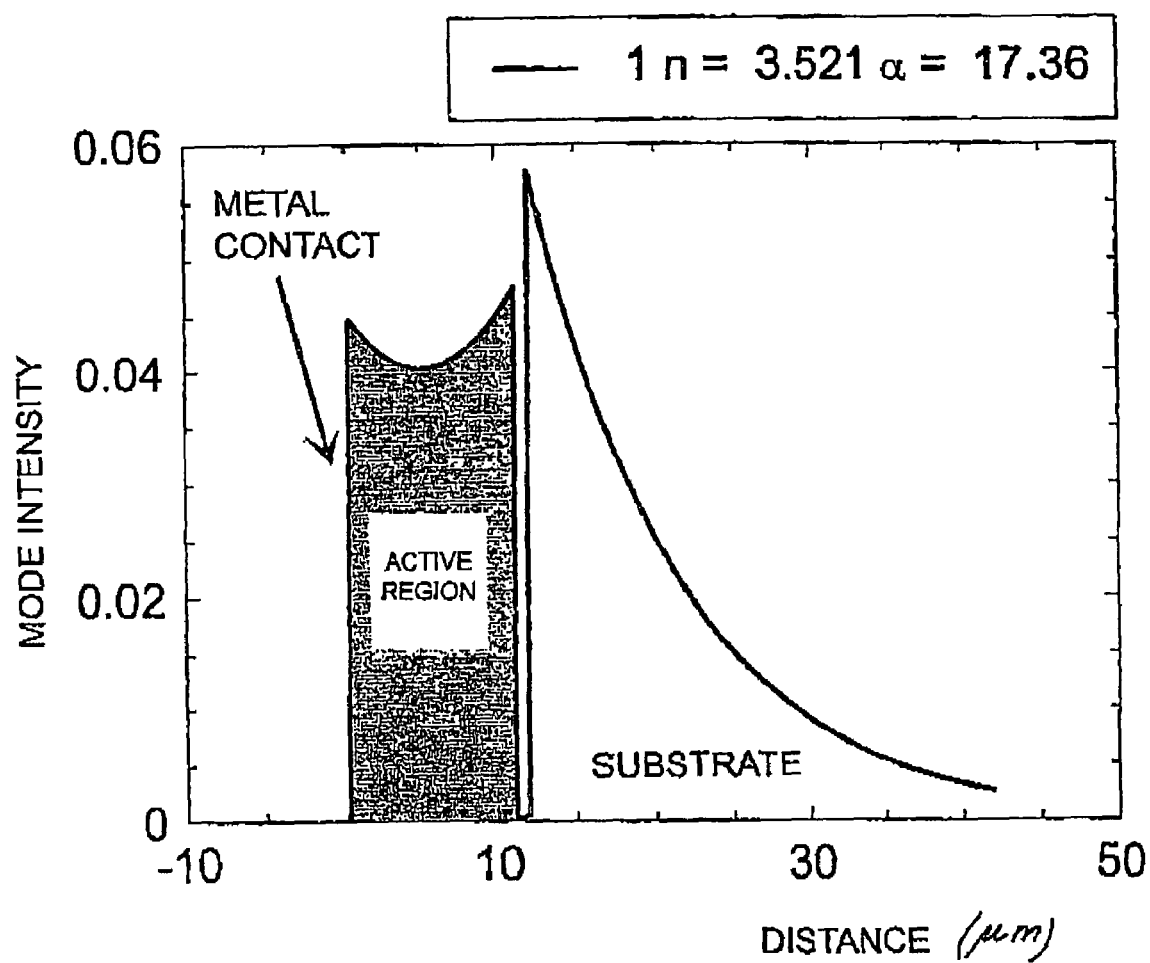
Figure 4:
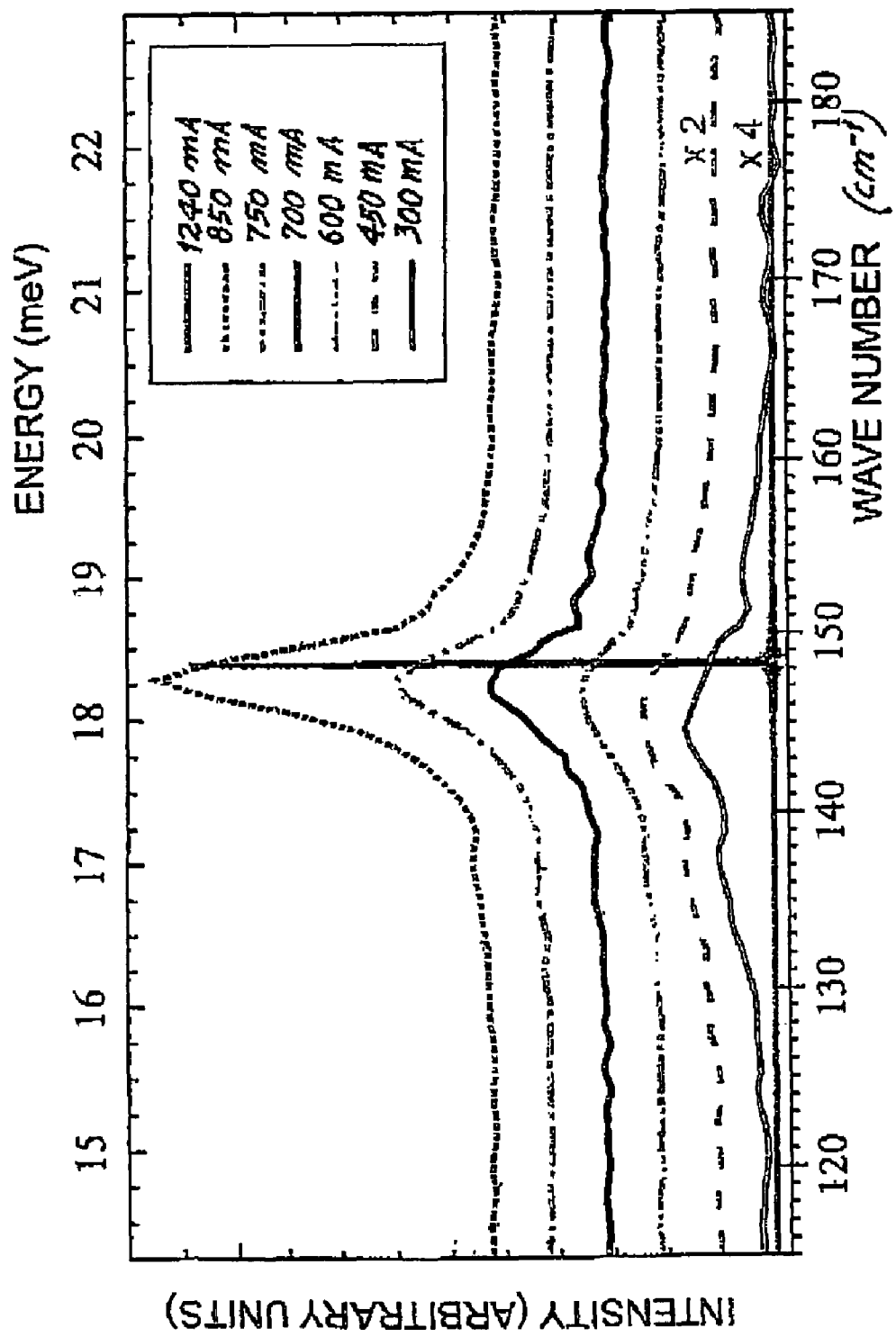
Figure 5:
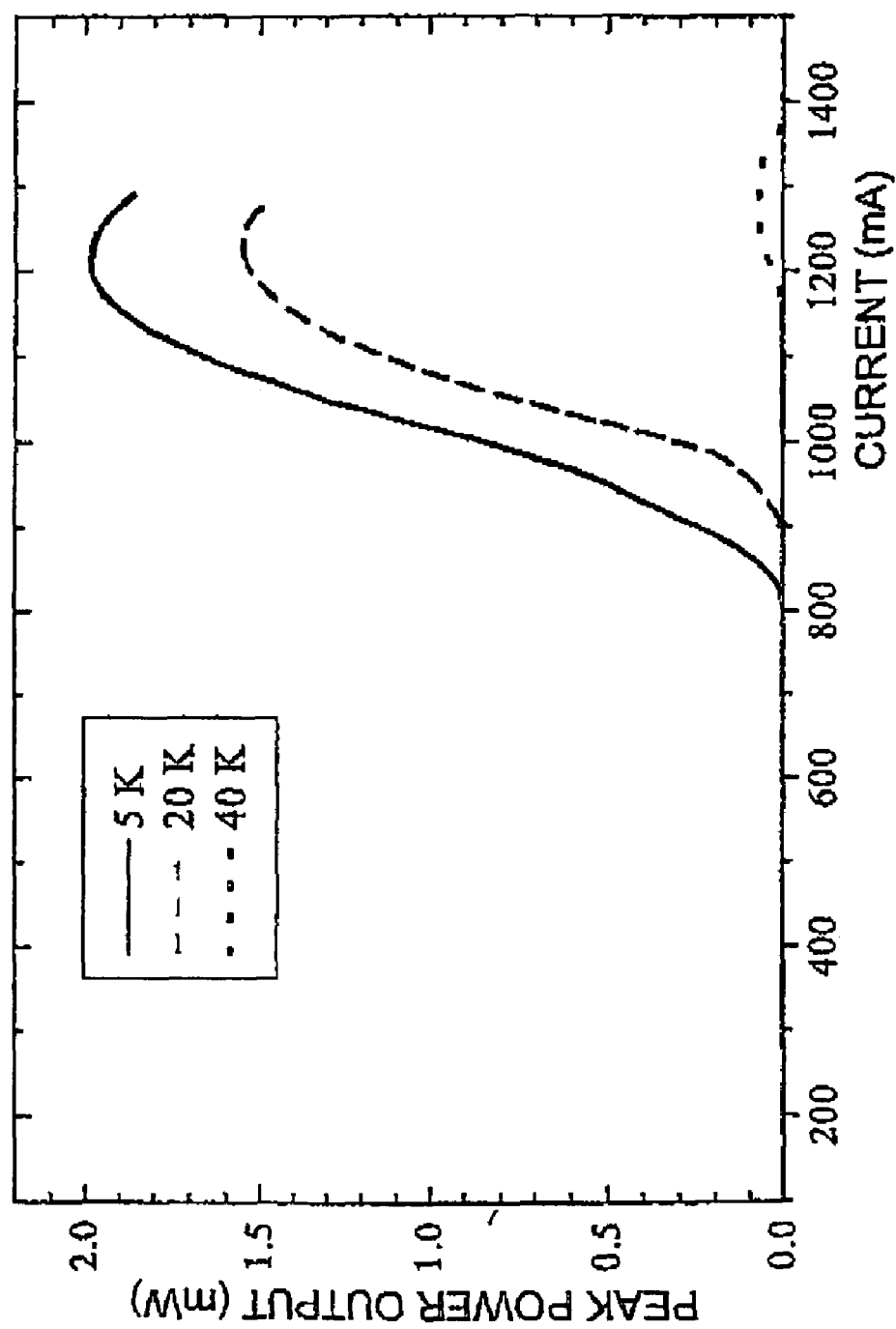

Further advantages and characteristics will become clear from the following detailed description which is given with reference to the appended drawings, in which:

FIG. 1 is a schematic, perspective view of an embodiment of the present invention in a Fabry-Perot laser device with a ridge cavity. The insulating layer can be removed, limiting the metallization of the upper contact to the top of the strip. This is feasible for strip widths >100 microns;

FIG. 2 is a graph showing the calculated profile of the fundamental TM optical mode confined by the presence of an 800 nm thick layer of GaAs n-doped at 5×10$^{18}$ cm$^{-3}$ within nominally non-doped GaAs. The wavelength of the radiation is 70 microns;

FIG. 3 is a graph which shows the calculated profile of the fundamental TM optical mode within the finished device according to the embodiment of FIG. 1. The upper metal contact has been simulated, taking into consideration a thickness of 300 nm and the values obtained in the literature for gold at the operating wavelength of 70 microns. The attenuation factor of the mode is about 17 cm$^{-1}$ with a factor of confinement to the active region (indicated by the area in grey) of 0.46;

FIG. 4 is a graph which shows the emission spectrum from a 1.2 mm long and 150 µm wide facet of the embodiment of the Fabry-Perot device of FIG. 1, as a function of the pulsed current applied. Temperature about 8 K; and FIG. 5 is a graph which shows power output as a function of current applied for the device of FIG. 1, at various temperatures. The laser emission threshold is about 450 A/cm$^2$. Maximum operating temperature 45 K.

With reference to FIG. 1, a semiconductor laser 10 comprises an active region 12 which can produce a stimulated emission of radiation with a central wavelength in the far infrared region, in response to a pumping energy applied thereto.

The active region 12 is delimited on its lower side by a thin wave-guide layer 16 which is interposed between the active region 12 and a substrate 18. The guide layer 16 thus forms an interface 16a with the active region 12 and an interface 16b with the substrate 18.

The guide layer 16 is formed by a semiconductor with high doping, preferably with a concentration of majority carriers of the order of 10$^{18}$ cm$^{-3}$.

The thin, highly doped semiconductor layer 16 is in conditions such that the plasma frequency of the electron gas lies in the middle infrared range and the real part of the dielectric constant of the layer therefore becomes negative at frequencies in the THz range, whilst remaining (in modulus) of a magnitude more or less comparable with that of a non-doped semiconductor. As can be seen in FIG. 2, in these circumstances, a thin layer having the characteristics of the layer 16 and inserted in a normal semiconductor structure permits the formation of a TM mode that is strongly confined close to the layer. The calculated intensity profile for a mode of this type at the wavelength of 70 µm in a non-doped GaAs sample with an 800 nm layer of GaAs n-doped at 5×10$^{18}$ cm$^{-3}$ within it is shown in this drawing. It will be noted that the radiation is confined to a total thickness of barely one tenth of a micron, with a pronounced maximum around the doped layer but with very low intensity within it.

The physical origin of this mode can be understood qualitatively in the following manner. The negative dielectric constant $\epsilon_1$ of the doped layer involves that its interface with the normal semiconductor can support surface plasmon modes. The fact that it is only weakly negative, however, entails a considerable penetration into the doped layer which, together with its minimal thickness, results in a coupling of the surface plasmons of the two interfaces to form the new mode shown in FIG. 2. The spatial extent of this mode in the surrounding semiconductor is controlled by the magnitude of the dielectric constant of the doped layer (which can be modified by varying the degree of doping). As already pointed out with reference to equation (1), this extent is in fact, as a first approximation, directly proportional to the root of $-(\epsilon_1+\epsilon_2)$ and a negative but minimal $Re(\epsilon_1)$ thus results in the closer confinement of the radiation. However, this does not increase the losses of the mode in an unacceptable manner, as in the case of a simple surface plasmon, given the small thickness of the doped layer relative to its coefficient of absorption. The maximum confinement is achieved, more precisely, when $Re(\epsilon_1+\epsilon_2)$ becomes of the order of $Im(\epsilon_1+\epsilon_2)$, that is, with dopings of the order of $10^{18}$ cm$^{-3}$ for GaAs. In this embodiment, the best ratio between mode amplitude and losses is obtained with the use of an n-doping of $2\times10^{18}$ cm$^{-3}$ and a thickness of 800 nm, which correspond to a coefficient of absorption of the mode of barely 7 cm$^{-1}$ whilst keeping the confinement at about twenty microns.

With further reference to FIG. 1, the guide layer 16 advantageously serves as a base for the electrical contacting of the active region 12 by means of a contact 20 disposed directly on the layer 16. It is thus possible to use non-doped substrates which are much more transparent in the far infrared than those that are conventionally used. In this embodiment of the laser device, it has therefore been arranged to grow the doped layer 16 directly on the non-doped GaAs substrate 18 and then to grow the active region 12 described hereinafter (with a thickness of about 11 microns). At this point the need to provide another electrical contact 22, this time on top of the active region 12, requires the deposition of a metal layer.

In a preferred embodiment of the laser device, this contact 22 is disposed directly on the active region 12 so as to form an interface 22a therewith. Outside the interface 22a, the contact 22 is separated from the active region 12 solely by a 200 nm layer GaAs layer 24 doped at $5\times10^{18}$ cm$^{-3}$. This configuration permits a good conductivity of the contact. A layer 25 of insulating material (for example, $SiO_2$ or $Si_3N_4$) may also be deposited beforehand at the sides of the strip (or ridge, which will be discussed in greater detail below) if the lateral dimensions thereof (for example <100 μm) necessitate, for the connection (bonding), an extension of the metallization of the contact 22 well beyond the width of the above-mentioned ridge (these are not per se the only possible solutions and other geometrical arrangements for the deposition of the upper contact may be provided without, however, departing from the spirit of the invention). The particular consequence of this choice is that a further surface plasmon bound to the interface 22a with the metal of the contact 22 is mixed with the mode of the wave-guide according to the present invention, resulting in the mode of the finished device shown in FIG. 3. The increase in losses is due to a large extent to the doping, which although low is necessary in the active region 12, and only to a minimal extent to the presence of the upper metal contact 22. The value of about 17 cm$^{-1}$ is in any case very low for a wavelength of 70 microns. The confinement factor $\Gamma$ of the mode in the active region is 0.46. These values indicate the need to achieve a gain of at least 30-40 cm$^{-1}$ in the active region 12.

In one embodiment of the laser device according to the present invention, the active region 12 is based on the use of $GaAs/Al_{0.15}Ga_{0.85}As$ superlattices. Naturally, the invention is not limited to this particular type of active region of the laser device since the invention is applicable to TM-polarized THz emitters in general. In this embodiment, the population inversion is achieved by electron injection between the states at the edge of the first energy minigap in the above-mentioned superlattices. In particular, superlattices of non-uniform period or "chirped" are used, enabling well-delocalized minibands to be maintained even in the presence of the electric field that is necessary for the operation of the device (A. Tredicucci et al., Appl. Phys. Lett. 73, 2101, 1998 and F. Capasso et al., U.S. Pat. No. 6,055,254). The active regions of QC lasers of longer wavelength are based on this approach (A. Tredicucci et al., Appl. Phys. Lett. 76, 2164, 2000, R. Colombelli et al., Appl. Phys. Lett. 78, 2620, 2001) and their use at energies less than that of the optical phonon (that is, at THz frequencies) has recently been discussed (Köhler et al., Appl. Phys. Lett. 79, 3920, 2001). In this latter publication, a particular design of the active material capable of leading to gains of the order of 30 cm$^{-1}$, which are thus compatible with the wave-guide configuration according to the invention, was proposed. A series of "chirped" superlattices nominally identical to those described in Köhler et al., Appl. Phys. Lett. 79, 3920, 2001 and spaced apart by suitable layers that are designed, according to the usual layout of QCLs, to extract the electrons from the first miniband of one superlattice and to inject them into the second miniband of that of the subsequent period, has therefore been grown in the region intended for the active material of the laser device. In order to cover the required 11 microns, a total of 104 SL units/injector were required. The complete structure of the sample produced, which was capable of emitting at a central wavelength of λ=69 μm, is given in detail in Table 1 below. This structure has an overall thickness of 11.9643 μm plus the thickness of the substrate.

TABLE 1

| TYPE | COMPOSITION | DOPING | THICKNESS | |
|---|---|---|---|---|
| n$^{++}$ | GaAs | >5 × 10$^{18}$ cm$^{-3}$ | | 200 Å |
| N | injector | 4 × 10$^{16}$ cm$^{-3}$ | 547 Å | Repeated 104× |
| non-doped | active zone | | 502 Å | |
| N | injector | 4 × 10$^{16}$ cm$^{-3}$ | 547 Å | |
| n$^{++}$ | GaAs | 2 × 10$^{18}$ cm$^{-3}$ | 8000 Å | |
| non-doped | semi-insulating GaAs (substrate) | | | |

The structures of the injector and of the active zone which appear in Table 1 are respectively given in Tables 2 and 3 below.

TABLE 2

| TYPE | COMPOSITION | DOPING | THICKNESS |
|---|---|---|---|
| I | GaAs | | 103 Å |
| I | $Al_{0.15}Ga_{0.85}As$ | | 29 Å |
| N | GaAs | 4 × 10$^{16}$ cm$^{-3}$ | 102 Å |
| I | $Al_{0.15}Ga_{0.85}As$ | | 30 Å |
| I | GaAs | | 108 Å |
| I | $Al_{0.15}Ga_{0.85}As$ | | 33 Å |
| I | GaAs | | 99 Å |
| I | $Al_{0.15}Ga_{0.85}As$ | | 43 Å |

TABLE 3

| TYPE | COMPOSITION | THICKNESS |
|---|---|---|
| I | GaAs | 188 Å |
| I | $Al_{0.15}Ga_{0.85}As$ | 8 Å |
| i | GaAs | 158 Å |
| i | $Al_{0.15}Ga_{0.85}As$ | 6 Å |

TABLE 3-continued

| TYPE | COMPOSITION | THICKNESS |
|---|---|---|
| I | GaAs | 117 Å |
| I | Al$_{0.15}$Ga$_{0.85}$As | 25 Å |

The sample was then made into strips (ridges) about 150 microns wide by wet etching to expose the layer with high doping. A metallization step was then performed by thermal evaporation of Au/Ge to form the contacts separately on the two zones of high doping, above and beneath the active region, as shown in FIG. 1. Given the dimensions of the device, it was arranged to perform wive connection (bonding) directly on the contacts, both on top of the ridges and at the side. For thinner ridges it would be necessary to use an insulating layer in order to have a metal surface large enough for the bonding (see FIG. 1). The strips were then defined into lasers about 1.2 mm long by cleavage along crystalline planes perpendicular to the strips. This left two facets at the ends of each strip which act as mirrors to delimit the laser cavity. The devices were then welded onto copper bars with an In/Ag paste and mounted in a cryostat with a continuous flow of helium for the measurements. Naturally, the selection of the geometry and of the characteristics of the resonator is not directly connected with the type of wave-guide used and other configurations (cylindrical cavities, distributed-feedback resonators, facets with dielectric coating etc.) may be produced without altering the spirit of the invention.

FIG. 4 shows the emission spectrum front a facet, measured at 8 K with a Fourier transform interferometer and an Si bolometric detector, as a function of the supply current of the device. Trains of 750 pulses (duration 200 ns, period 2 μs) were used, repeated at a frequency of 333 Hz. This was done in order to have a frequency comparable with the response frequency of the bolometer but without heating the sample too much. An emission peak at about 18 meV can be observed, well matched with the separation energy between the first two minibands of the superlattice. The intensity of the signal increases rapidly as the current increases, with a progressive narrowing of the line width up to a current of about 880 mA which identifies the laser threshold. Above this, the power increases by several orders of magnitude to a maximum value of a few mW and the emission is concentrated in a single mode of the cavity with a width of less than one tenth of a cm−1 (the resolution of the spectrometer used).

The curve of power output as a function of current is given in FIG. 5, for various temperatures. The threshold behaviour typical of laser emission is shown well, with a maximum operating temperature of about 45 K.

The performance of the above-described embodiment of the device is still quite limited but it is stressed that this is purely a first experimental construction. In fact there are various possible variations which will enable considerable future improvements to be achieved. For example, it is expected that some simple solutions such as a reduction in the lateral dimensions of the device, the use of longer ridges, and the coating of the facets to increase their reflectivity will lead to drastic improvements in terms of power, maximum temperature, and capacity for continuous operation. The geometry of the wave-guide may in turn be further improved, for example, with the use of thicker active regions or with a different arrangement of the upper contact. However, the behaviour of the device of the invention as implemented in the above-described embodiment is excellent per se, with very low losses and large confinement factors. Its applicability at different frequencies and with different active regions throughout the 1-10 THz range is ensured.

The invention claimed is:

1. A semiconductor laser comprising:
   an active region (12) which, in response to a pumping energy applied thereto, produces a stimulated emission of radiation with a central wavelength (λ) in the far infrared region, and
   at least one confinement region (16, 18, 22) for confining the radiation in the active region (12) and comprising at least one interface (16a, 16b, 22a) between adjacent layers for supporting surface plasmon modes generated by an interaction of the interface with the radiation, wherein
   the at least one confinement region (16, 18, 22) comprises a wave-guide layer (16) which is delimited on opposite sides by a first interface and by a second interface (16a, 16b), the guide layer (16) being doped in a manner such that the first and second interfaces (16a, 16b) support the plasmon modes, respectively, and the guide layer (16) being of a thickness (d) such as to bring about the accumulation of the plasmon modes in proximity to the first and second interfaces (16a, 16b), outside the layer (16), and substantially a suppression of the plasmon modes, inside the layer, wherein the mode intensity of the plasmon modes in proximity to the second interface (16b) is similar to the mode intensity of the plasmon modes in proximity to the first interface (16a).

2. A laser according to claim 1 wherein the plasmon modes of the first and second interfaces (16a, 16b) are mutually coupled.

3. A laser according to claim 2 wherein the wave-guide layer (16) has a dielectric constant ($\epsilon_1$) with a negative real part and is interposed between regions (12, 18) having respective dielectric constants ($\epsilon_2$ and $\epsilon_3$) with a positive real part but with a modulus substantially of the same order as the modulus of the dielectric constant ($\epsilon_1$) of the guide layer.

4. A laser according to claim 3 wherein the real part of the sum of the dielectric constant of the guide layer (16) and the respective dielectric constants of the regions (12, 18) between which the guide layer is interposed is substantially of the order of the imaginary part of the sum.

5. A laser according to claim 1 wherein the active region (12) comprises a quantum-cascade active region.

6. A laser according to claim 5 wherein the active region comprises a structure with GaAs/Al$_{0.15}$Ga$_{0.85}$As superlattices of non-uniform period.

7. A laser according to claim 1 wherein the guide layer (16) is interposed between the active region (12) and a substrate region (18).

8. A laser according to claim 7 wherein the wave-guide layer (16) is in contact with the active region (12).

9. A laser according to claim 1, further comprising a first electrical contact region (20) disposed directly on the guide layer (16).

10. A laser according to claim 1, further comprising a second electrical contact region (22) disposed directly on the active region (12).

11. A laser according to claim 1, wherein the laser produces a stimulated emission of radiation with a frequency of between 1 and 10 THz.

12. A laser according to claim 1 wherein the thickness (d) of the wave-guide layer (16) is of the order of 100 nm.

13. A laser according to claim 1 wherein the wave-guide layer (16) is formed by an n-type semiconductor in which the concentration of electrons is of the order of $10^{18}$ cm$^{-3}$.

* * * * *